(12) United States Patent
Barsun et al.

(10) Patent No.: US 6,538,889 B1
(45) Date of Patent: Mar. 25, 2003

(54) HEAT DISSIPATION DEVICE RETENTION ASSEMBLY

(75) Inventors: Stephan Karl Barsun, Auburn, CA (US); Jeremy Ian Wilson, Rocklin, CA (US); Thomas J. Augustin, El Dorado Hills, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/981,146

(22) Filed: Oct. 16, 2001

Related U.S. Application Data

(63) Continuation-in-part of application No. 09/957,166, filed on Sep. 20, 2001.

(51) Int. Cl.[7] ................................................ H05K 7/20
(52) U.S. Cl. ........................ 361/704; 361/707; 361/709; 361/710; 361/719; 361/720; 165/80.3; 165/185; 439/342
(58) Field of Search ................................ 361/702–707, 361/709–711, 717–719, 722; 257/718–727, 706, 713; 165/80.1, 80.3, 185; 174/16.3; 439/342, 259; 24/459

(56) References Cited

U.S. PATENT DOCUMENTS

| | | | | |
|---|---|---|---|---|
| 5,256,080 A | * | 10/1993 | Bright | 439/342 |
| 5,893,770 A | * | 4/1999 | Gober | 439/342 |
| 6,164,999 A | * | 12/2000 | McCutchan et al. | 439/342 |
| 6,175,499 B1 | * | 1/2001 | Adams et al. | 361/704 |
| 6,243,267 B1 | * | 6/2001 | Chuang | 361/704 |
| 6,280,222 B1 | * | 8/2001 | Walkup | 439/331 |
| 6,332,251 B1 | * | 12/2001 | Ho et al. | 24/459 |

* cited by examiner

*Primary Examiner*—Boris Chérvinsky

(57) ABSTRACT

A method and apparatus to encourage correct operator assembly and disassembly of a component in a socket, and the component has a heat dissipation device attached to a substrate. A first embodiment of the invention involves a method to assemble a component and a heat dissipation device to a socket on a substrate using a retention assembly. A second embodiment of the invention involves a method to disassemble a component and a heat dissipation device from a socket on a substrate using a retention assembly. A third embodiment of the invention involves an assembled substrate with a retention assembly to limit operator ability to open and close a socket holding a component, relative to the engagement and disengagement of the retention assembly attached to the component.

20 Claims, 7 Drawing Sheets

HEAT DISSIPATION DEVICE RETENTION ASSEMBLY

CROSS-REFERENCE TO CO-PENDING APPLICATIONS

This application is a continuation-in-part of the co-pending U.S. patent application, Ser. No. 09/957,166, entitled "Socket Activation Interlock," filed on Sep. 20, 2001, by the common assignee, which is hereby incorporated by reference.

BACKGROUND OF THE INVENTION

1. Field of the Invention

This invention relates generally to preventing damage to component sockets on cards, and more particularly to preventing damage caused when an operator prematurely opens or closes a zero-insertion-force socket, and retaining loose retention hardware.

2. Description of the Prior Art

In many data processing systems (e.g., computer systems, programmable electronic systems, telecommunication switching systems, control systems, and so forth) one or more components are attached to substrates (e.g., printed circuit boards, or other types of motherboards) on sockets for easy removal and replacement. If a zero-insertion-force (ZIF) socket is used to make contact between the component and substrate, and the ZIF socket is opened after the component's heat dissipation device is released from the substrate, there is no damage caused to the ZIF socket or substrate. However, if the ZIF socket is opened while a component's heat dissipation device is still attached to the substrate, there is a lateral force imparted to the ZIF socket, typically causing permanent damage to the ZIF socket and substrate, and creating a need for major rework repair to the substrate and ZIF socket.

Conventional substrates presently have no mechanism to prevent substrate and socket damage by an operator mistake in sequentially opening the ZIF socket before releasing the heat dissipation device attachment to the substrate. Loose retention hardware is a related problem, since it is easy for an operator mistake to occur when there are several loose parts requiring manual assembly while attaching the heat dissipation device to the substrate.

What is needed is a retention assembly that guides a human operator in assembling or disassembling a component in a socket from a substrate in such a way as to avoid damage to the socket and substrate holding the component. What is also needed is a retention assembly that minimizes or eliminates loose retention hardware.

SUMMARY OF THE INVENTION

The present invention provides a retention assembly that guides a human operator in assembling or disassembling a component in a socket from a substrate in such a way as to avoid damage to the socket and substrate holding the component. The retention assembly also minimizes or eliminates loose retention hardware.

A first aspect of the invention is directed to a method to assemble a component and heat dissipation device to a socket on a substrate using a retention assembly. The method includes attaching the component to the heat dissipation device; placing the component in the socket on the substrate; activating the socket to engage the component in the socket; positioning a retention assembly over the heat dissipation device; and attaching the retention assembly to the substrate, wherein the retention assembly prevents attachment of the heat dissipation device to the substrate until after the activation of the socket.

A second aspect of the invention is directed to a method to disassemble a component and heat dissipation device from a socket on a substrate using a retention assembly. The method includes disengaging the retention assembly and the heat dissipation device from the substrate; opening the socket; and removing the component from the socket, wherein the retention assembly prevents the opening of the socket until after the disengagement of the retention assembly and the heat dissipation device from the substrate.

A third aspect of the invention is directed to an assembled substrate with a retention assembly to limit operator ability to open and close a socket holding a component, relative to the engagement and disengagement of a heat dissipation device attached to the component. The assembled substrate includes a substrate; a socket mounted on the substrate, including a socket control to open or close the socket; a component inserted in the socket; and a heat dissipation device attached by a retention assembly to the substrate, wherein the retention assembly limits operator access to the socket control.

These and other objects and advantages of the invention will become apparent to those skilled in the art from the following detailed description of the invention and the accompanying drawings.

DETAILED DESCRIPTION OF PREFERRED EMBODIMENTS OF THE INVENTION

The present invention provides a retention assembly to prevent damage to a socket (e.g., a zero-insertion-force socket) when a component's heat dissipation and/or attachment device is not released before the release of the socket. While the discussion below is directed to an application of the invention to secure components to a substrate, such as a printed circuit board (PCB), the invention can also be applied to any type of component attached on any type of substrate (e.g., a multi-chip module, or another substrate upon which electrical components can be assembled). The invention can also be applied to instances where a component does not need a heat dissipation device attached to the component when it is operating in a socket on a substrate.

Figure 1:
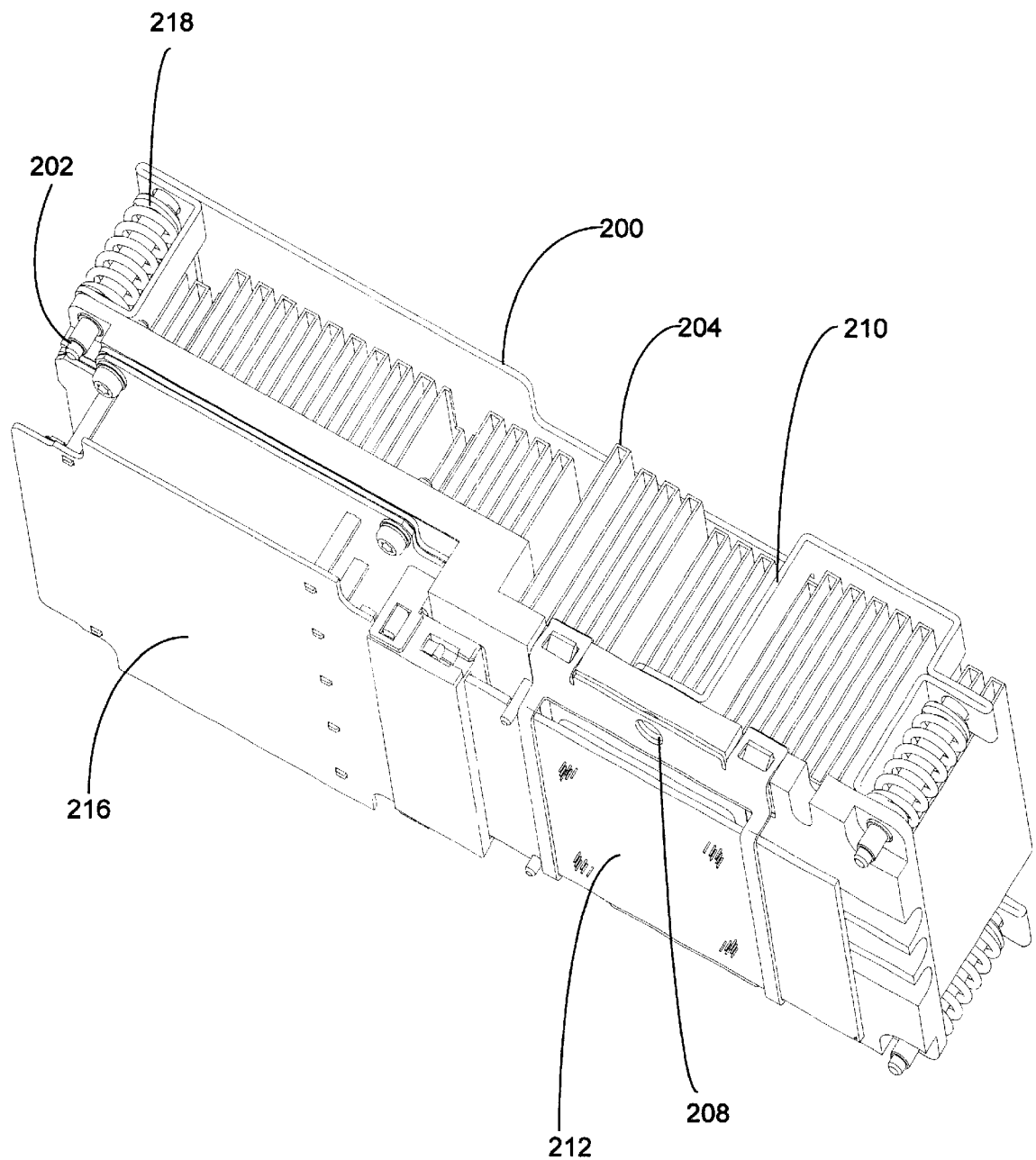
FIG. 1 illustrates a perspective view of one preferred embodiment of the present invention using a retention assembly to attach a heat dissipation device to a substrate, on top of a component and a power pod for the component.

FIG. 1 illustrates a perspective view of one preferred embodiment of the present invention using a retention assembly 200 to attach a heat dissipation device (e.g., a heatsink, heat-pipe, cooling fan, or an equivalent) 204 to a substrate (not shown), on top of a component (e.g., a processor, or another electronic device) 212 and a power pod 216 for the component 212. The retention assembly 200 is designed to attach the heat dissipation device 204 to a substrate (not shown), on top of the power pod 216 and the component 212 and socket (not shown). A number of studs 202 are enclosed by springs 218, and the studs 202 compress the springs 218 to make the physical attachment to the substrate. A hole 208 provides access to a socket control (not shown) to engage or disengage the socket, and the retention assembly 200 has an arm 210 that blocks operator access through hole 208 to the socket control used to engage or disengage the socket.

Figure 2:
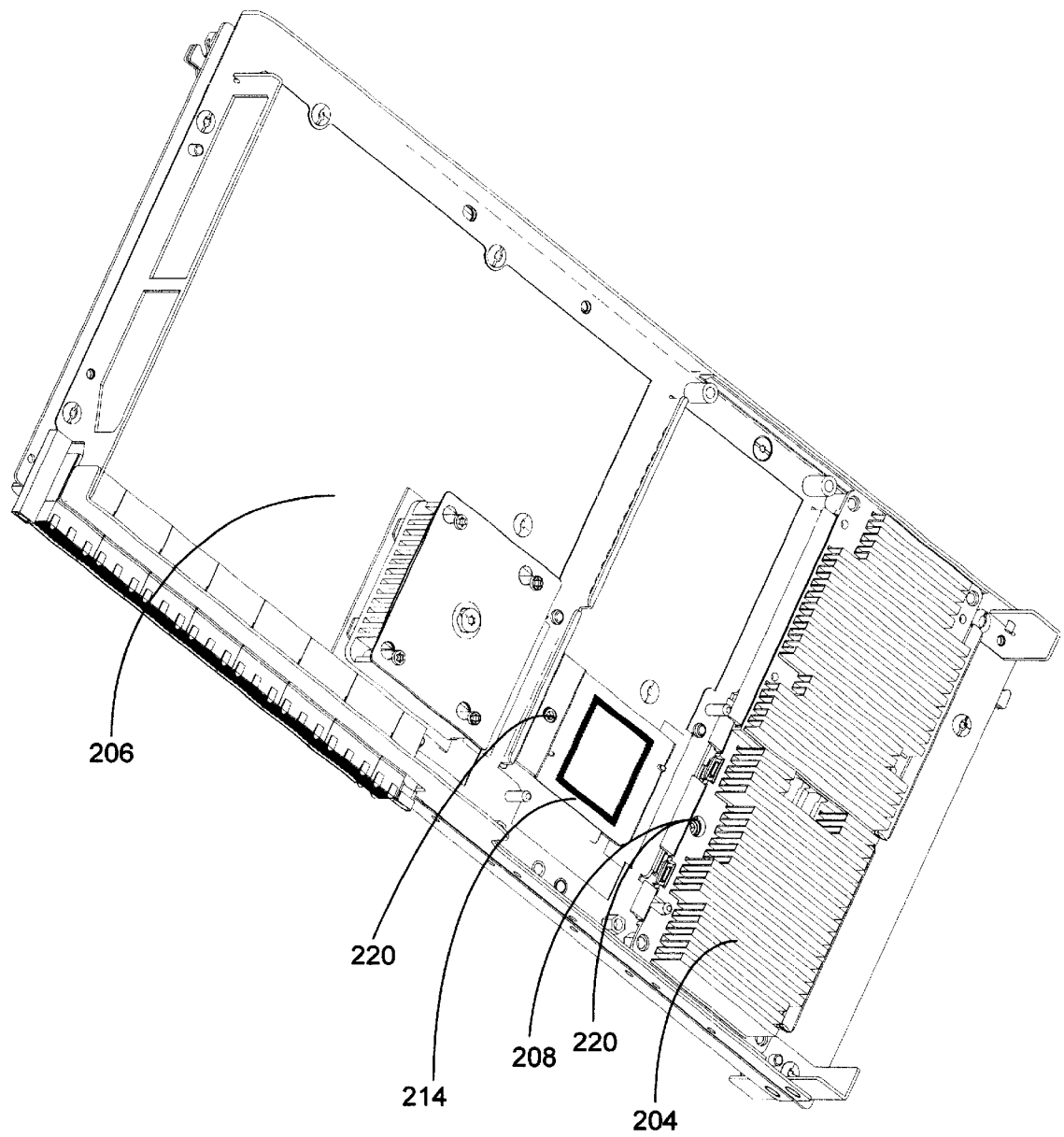
FIG. 2 illustrates a perspective view of one preferred embodiment of the present invention with the retention assembly removed to show a heat dissipation device placed on a substrate.

FIG. 2 illustrates a perspective view of one preferred embodiment of the present invention with the retention assembly 200 removed to show a heat dissipation device 204 placed on a substrate (e.g., a PCB, multi-chip module, a processor cell board, or equivalent) 206. Adjacent to the heat dissipation device 204 is an empty location with a socket (e.g., a ZIF socket or an equivalent) 214 to hold a component (not shown), and a socket control 220 to engage or disengage the socket 214. The heat dissipation device 204 that is shown also has a hole 208 to provide access to another socket control 220 seen through the hole 208.

Figure 3:
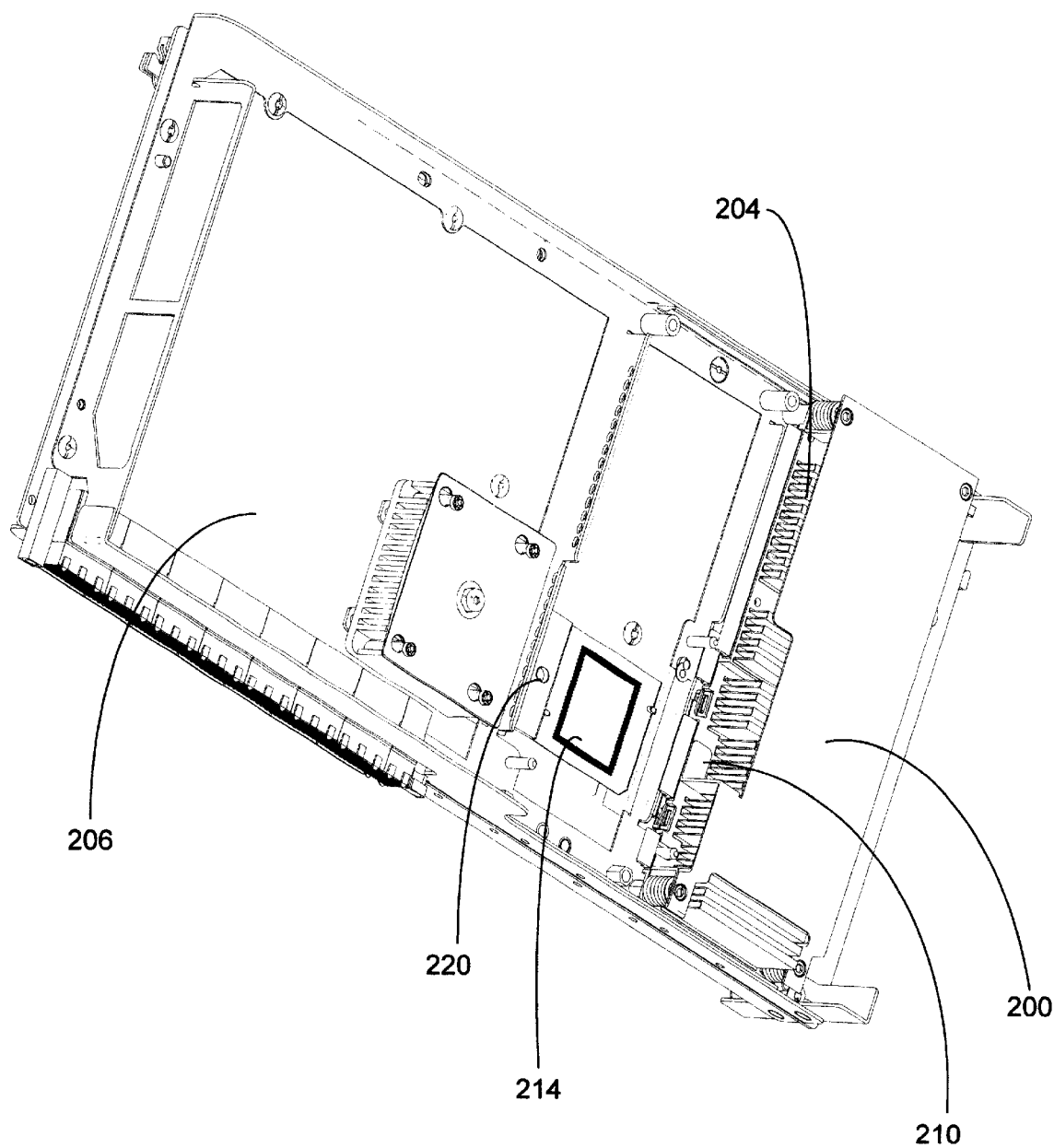
FIG. 3 illustrates another perspective view of FIG. 2 with a retention assembly according to one embodiment of the invention included on top of a heat dissipation device placed on a substrate.

FIG. 3 illustrates another perspective view of FIG. 2 with the retention assembly 200 according to one embodiment of the invention included on top of a heat dissipation device 204 placed on a substrate 206. Adjacent to the heat dissipation device 204 is an empty location with a socket 214 to hold a component (not shown), and a socket control 220 to engage or disengage the socket 214. The retention assembly 200 has an arm 210 that blocks operator access through a hole (not shown) to the socket control (not shown) used to engage or disengage a socket (not shown) identical to the adjacent socket control 220 shown on the socket 214.

The retention assembly 200 is preferably made by molding, stamping, or machining a piece of material. The retention assembly 200 (including the arm 210) can be fabricated from a piece of sheet metal, a molded piece of metal, a machined piece of metal, a molded piece of plastic, or a machined piece of plastic.

Figure 4:
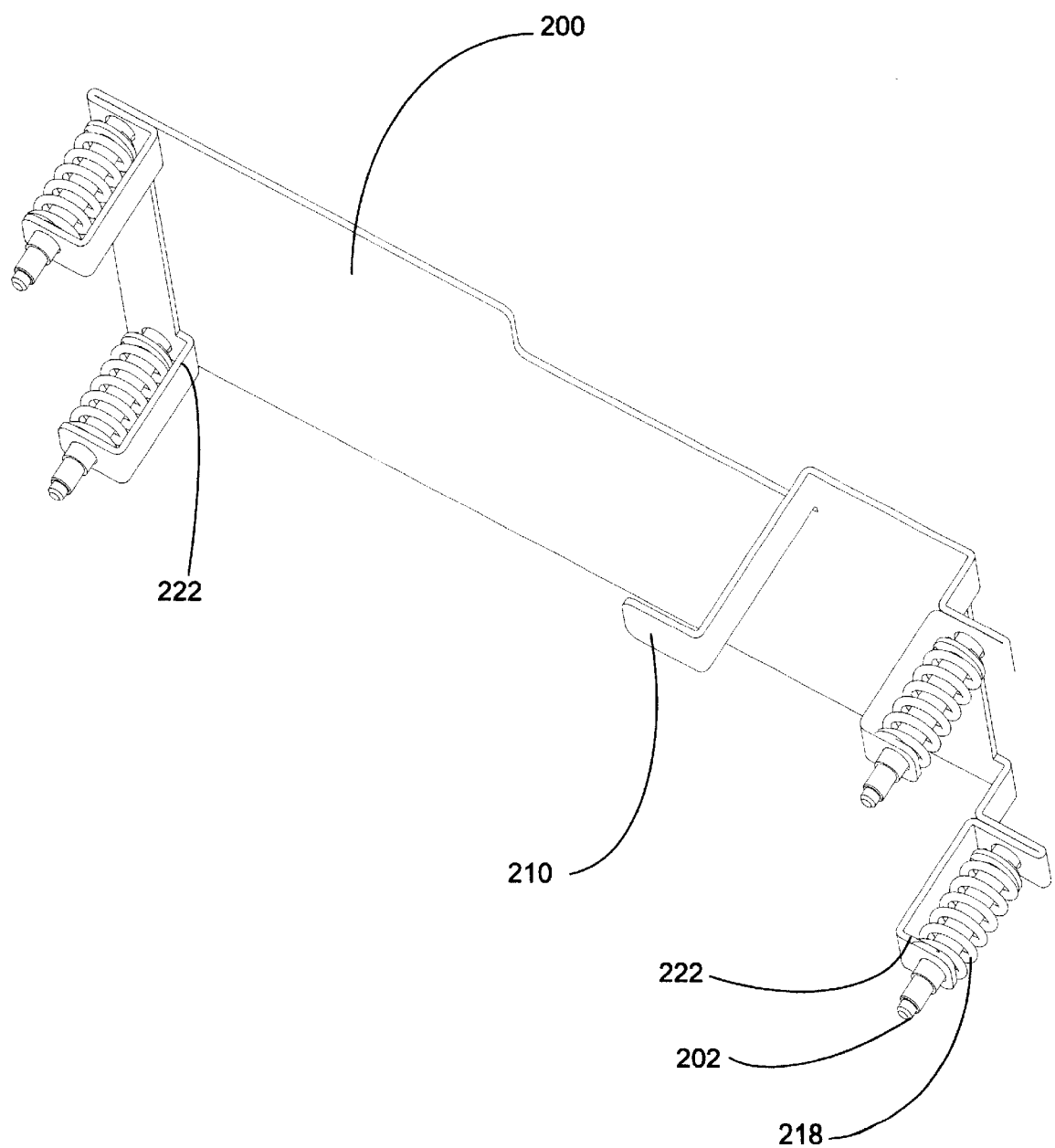
FIG. 4 illustrates a perspective view of the bottom of retention assembly, according to a preferred embodiment of the present invention.

FIG. 4 illustrates a perspective view of the bottom of the retention assembly, according to a preferred embodiment of the present invention. This embodiment has four studs 202 to attach the retention assembly 200 to a substrate (not shown). The studs 202 are enclosed in springs 218, and each stud 202 and each spring 218 is held by a clip 222 that is part of the retention assembly 200. The retention assembly 200 includes an arm 210 that will block operator access through a hole in an enclosed heat dissipation device (not shown) to the socket control used to engage or disengage the socket.

Figure 5:
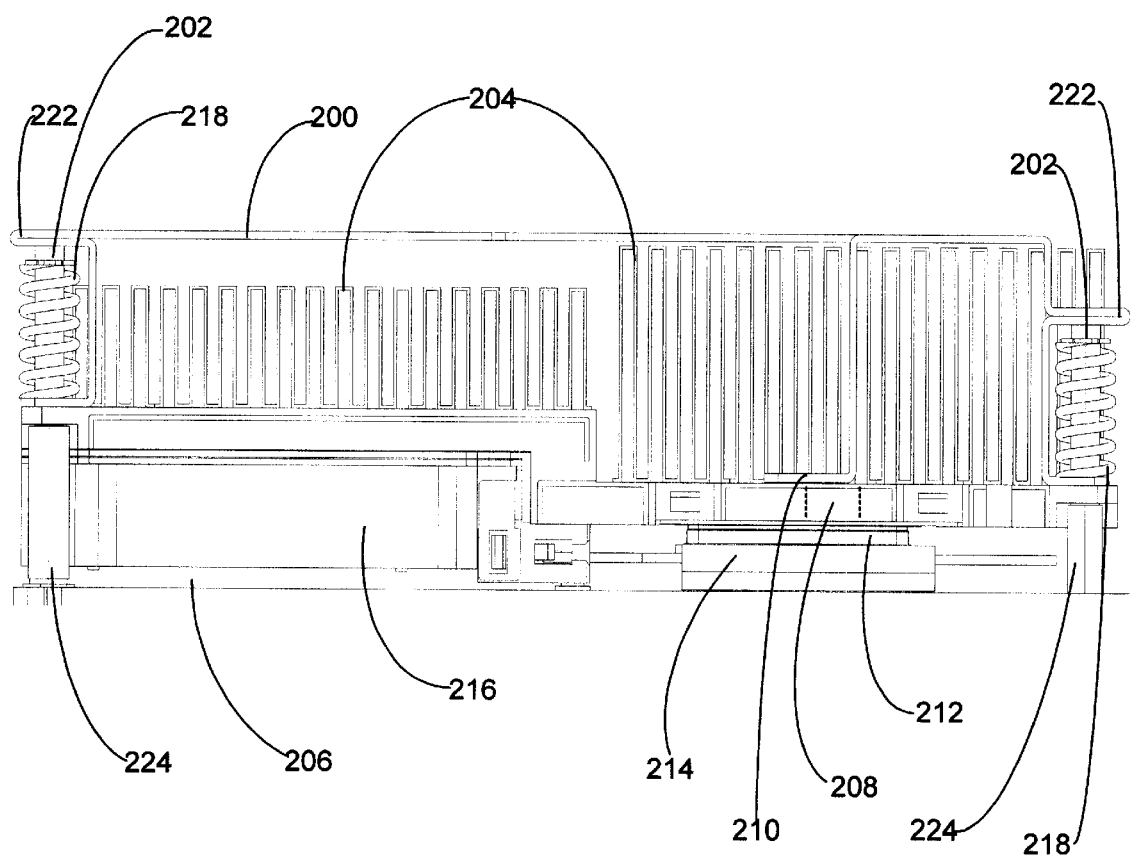
FIG. 5 illustrates a cross-sectional side view of an installed retention assembly, according to one preferred embodiment of the present invention.

FIG. 5 illustrates a cross-sectional side view of an installed retention assembly, according to one preferred embodiment of the present invention. This cross-sectional side view illustrates the retention assembly 200 enclosing a heat dissipation device 204, with each clip 222 of the retention assembly holding a stud 202 and a compressed spring 218. The retention assembly 200 is attached by studs 202 to a substrate 206, that holds a socket 214. The socket 214 holds a component 212. The substrate 206 also holds a power pod 216 with a standoff 224 through which a stud 202 is inserted. The retention assembly 200 also has an arm 210, which blocks access to hole 208 (hidden in this view and shown as dashed lines). The socket activation control (not shown) engages or disengages component 212 in socket 214, but the socket activation control is only accessed through hole 208, after the retention assembly 200 and the arm 210 are removed to allow operator access to the socket activation control.

Figure 6:
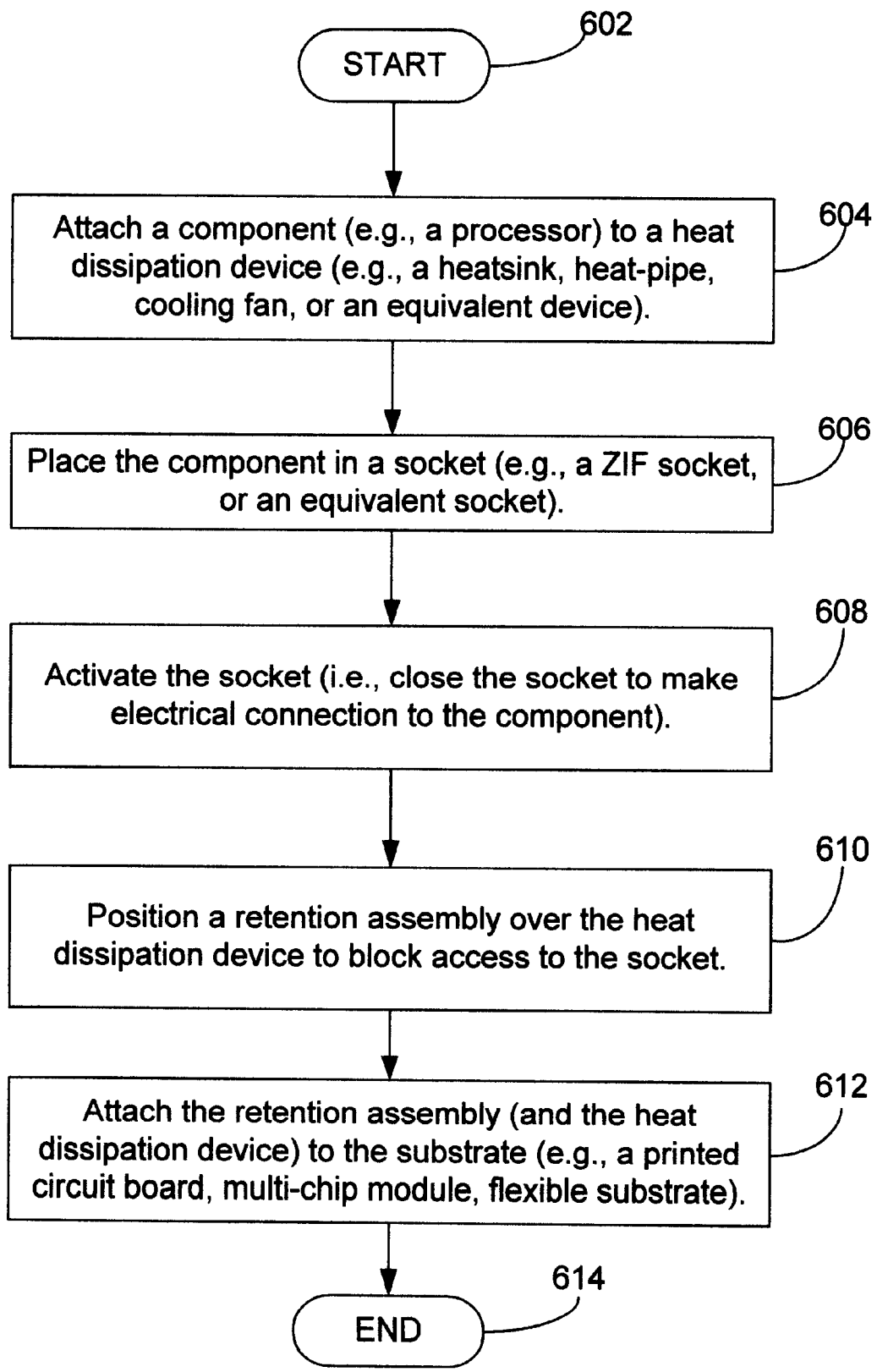
FIG. 6 illustrates a flow chart for a method to assemble a component and heat dissipation device on a substrate using a retention assembly in accordance with one embodiment of the present invention.

FIG. 6 illustrates a flow chart for a method to assemble a component and heat dissipation device on a substrate using a retention assembly in accordance with one embodiment of the present invention. The method starts in operation 602, and is followed by operation 604. In operation 604, there is an attachment of a component to a heat dissipation device. In operation 606, the component is placed in a socket on a substrate. Then operation 608 is next. In operation 608 the operator closes and engages the socket. In operation 610, the operator positions a retention assembly over the heat dissipation device to block access to the socket. The socket activation area is typically sufficient. In operation 612, the operator attaches the retention assembly (and thereby the heat dissipation device) to the substrate. Operation 614 is the end of the method.

Figure 7:
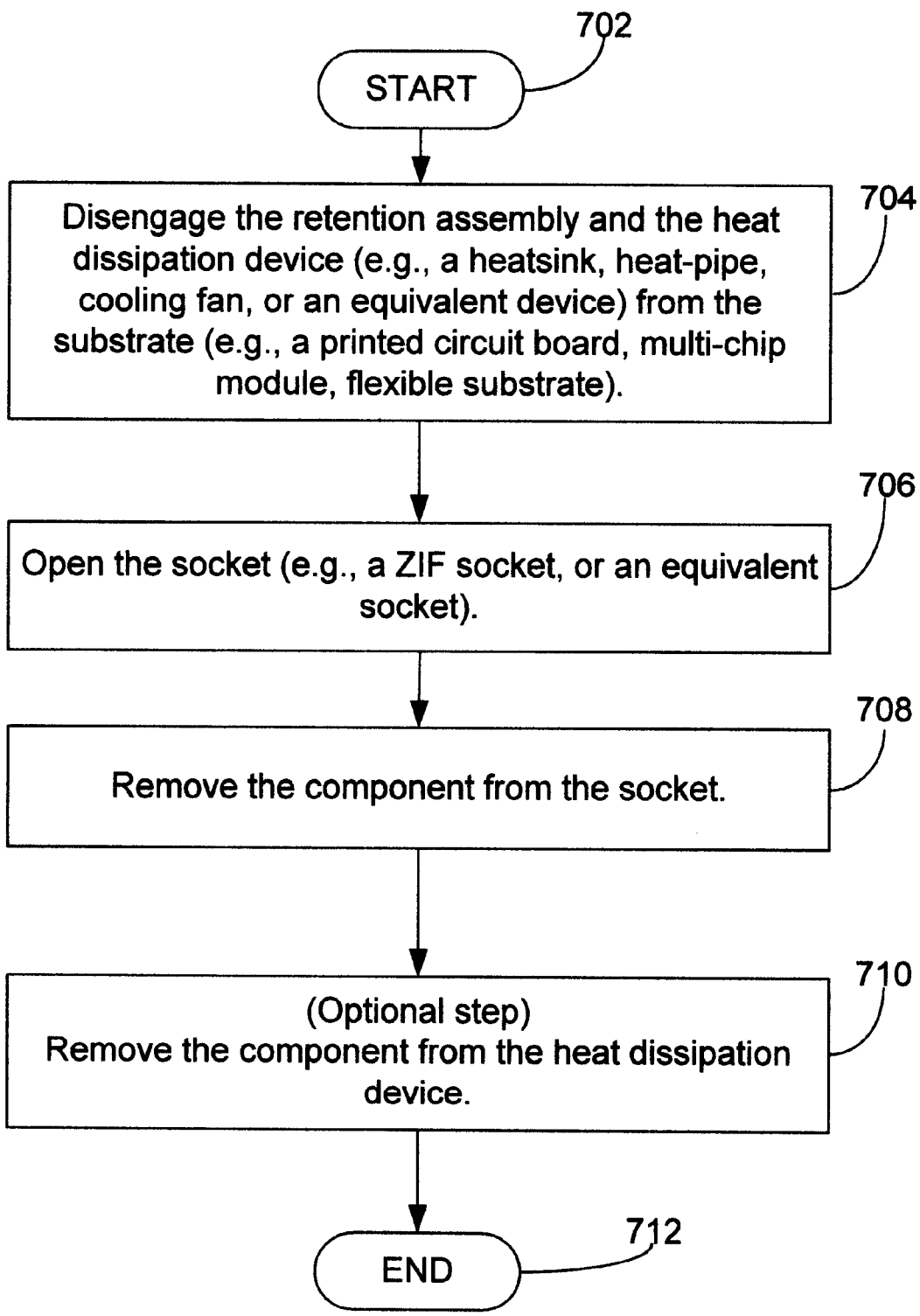
FIG. 7 illustrates a flow chart for a method to disassemble a component and heat dissipation device on a substrate using a retention assembly in accordance with one embodiment of the present invention.

FIG. 7 illustrates a flow chart for a method to disassemble a component and heat dissipation device on a substrate using a retention assembly in accordance with one embodiment of the present invention. The method starts in operation 702, and is followed by operation 704. In operation 704, there is a disassembly (i.e., disengagement) of the retention assembly (and thereby the heat dissipation device) from a substrate. In operation 706, a socket is opened on the substrate. Then operation 708 is next, where the operator removes a component (e.g., a processor, or another electronic device) from the socket. In optional operation 710, the operator removes the component from the heat dissipation device. Operation 712 is the end of the method.

The embodiments of the invention discussed above use both retention assemblies and heat dissipation devices. Alternative embodiments of the invention can use retention assemblies alone to block access to the socket, without the use of heat dissipation devices. Preferred embodiments of the invention can be applied to PCBs using through-hole technology or surface mount technology, or can be applied to other types of electrical component substrates (e.g., multi-chip modules and flexible substrates).

The exemplary embodiments described herein are for purposes of illustration and are not intended to be limiting. Therefore, those skilled in the art will recognize that other embodiments could be practiced without departing from the scope and spirit of the claims set forth below.

What is claimed is:

1. A method to assemble a component and heat dissipation device to a socket on a substrate using a retention assembly, comprising:
    attaching said component to said heat dissipation device;
    placing said component in said socket on said substrate;
    activating said socket to engage said component in said socket;
    positioning a retention assembly over said heat dissipation device; and
    attaching said retention assembly to said substrate, wherein said retention assembly prevents attachment of said heat dissipation device to said substrate until after said activating of said socket.

2. The method of claim 1, wherein said socket is a zero-insertion-force (ZIF) socket.

3. The method of claim 1, wherein said retention assembly blocks attachment of said heat dissipation device to said substrate by blocking a hole in said heat dissipation device.

4. The method of claim 1, wherein said substrate is chosen from substrates consisting of: a printed circuit board (PCB), a multi-chip module (MCM), and a flexible substrate.

5. The method of claim 1, wherein said heat dissipation device is chosen from the group of heat dissipation devices consisting of: a heatsink, a heat-pipe, or a cooling fan.

6. The method of claim 1, wherein said retention assembly is fabricated from a group of materials consisting of: a piece of sheet metal, a molded piece of metal, a machined piece of metal, a molded piece of plastic, or a machined piece of plastic.

7. A method to disassemble a component and heat dissipation device from a socket on a substrate using a retention assembly, comprising:

disengaging said retention assembly and said heat dissipation device from said substrate;

opening said socket; and removing said component from said socket, wherein said retention assembly prevents said opening of said socket until after said disengaging of said retention assembly and said heat dissipation device from said substrate.

8. The method of claim 7, further comprising:

removing said component from said heat dissipation device, after removing said component from said socket.

9. The method of claim 7, wherein said socket is a zero-insertion-force (ZIF) socket.

10. The method of claim 7, wherein said retention assembly blocks said opening of said socket until after said disengaging of said retention assembly and said heat dissipation device from said substrate by blocking a hole in said heat dissipation device.

11. The method of claim 7, wherein said substrate is chosen from substrates consisting of: a printed circuit board (PCB), a multi-chip module (MCM), and a flexible substrate.

12. The method of claim 7, wherein said heat dissipation device is chosen from the group of heat dissipation devices consisting of: a heatsink, a heat-pipe, or a cooling fan.

13. The method of claim 7, wherein said retention assembly is fabricated from a group of materials consisting of: a piece of sheet metal, a molded piece of metal, a machined piece of metal, a molded piece of plastic, or a machined piece of plastic.

14. An assembled substrate with a retention assembly to limit operator ability to open and close a socket holding a component, relative to the engagement and disengagement of a heat dissipation device attached to said component, comprising:

a substrate;

a socket mounted on said substrate, including a socket control to open or close said socket;

a component inserted in said socket; and a heat dissipation device attached by a retention assembly to said substrate, wherein said retention assembly limits operator access to said socket control.

15. The assembled substrate of claim 14, wherein said socket is a zero-insertion force (ZIF) socket.

16. The assembled substrate of claim 14, wherein said retention assembly blocks a hole to force operator attachment of said retention assembly to said substrate after activation of said socket.

17. The assembled substrate of claim 14, wherein said retention assembly blocks a hole to force operator opening of said socket after disengagement of said retention assembly from said substrate.

18. The assembled substrate of claim 14, wherein said substrate is chosen from substrates consisting of: a printed circuit board (PCB), a multi-chip module (MCM), and a flexible substrate.

19. The assembled substrate of claim 14, wherein said heat dissipation device is chosen from the group of heat dissipation devices consisting of: a heatsink, a heat-pipe, or a cooling fan.

20. The assembled substrate of claim 14, wherein said retention assembly is fabricated from a group of materials consisting of: a piece of sheet metal, a molded piece of metal, a machined piece of metal, a molded piece of plastic, or a machined piece of plastic.

* * * * *